United States Patent

Jenkins et al.

[11] Patent Number: 5,922,606
[45] Date of Patent: *Jul. 13, 1999

[54] FLUOROMETRIC METHOD FOR INCREASING THE EFFICIENCY OF THE RINSING AND WATER RECOVERY PROCESS IN THE MANUFACTURE OF SEMICONDUCTOR CHIPS

[75] Inventors: Brian V. Jenkins, LaGrange Park; John E. Hoots, St. Charles, both of Ill.

[73] Assignee: Nalco Chemical Company, Naperville, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/931,556

[22] Filed: Sep. 16, 1997

Related U.S. Application Data

[51] Int. Cl.$^6$ .................................................. G01N 21/64
[52] U.S. Cl. ................................ 436/55; 134/1.3; 134/2; 134/18; 436/56; 436/172; 438/5; 438/14; 438/16; 438/906
[58] Field of Search ................................ 436/56, 55, 172; 134/2, 18, 1.3; 438/5, 14, 16, 906

[56] References Cited

U.S. PATENT DOCUMENTS

| | | |
|---|---|---|
| 4,156,619 | 5/1979 | Griesshammer . |
| 4,276,186 | 6/1981 | Bakos et al. . |
| 4,536,322 | 8/1985 | Amstutz et al. . |
| 4,698,308 | 10/1987 | Ikeda . |
| 4,783,314 | 11/1988 | Hoots et al. . |
| 4,992,380 | 2/1991 | Moriarty et al. . |
| 5,153,674 | 10/1992 | Böbel et al. . |
| 5,328,556 | 7/1994 | Matlow . |
| 5,435,969 | 7/1995 | Hoots et al. . |
| 5,536,663 | 7/1996 | Mueller-Kirschbaum et al. . |
| 5,614,032 | 3/1997 | Wong . |
| 5,633,172 | 5/1997 | Shimazaki . |
| 5,686,314 | 11/1997 | Miyazaki . |
| 5,820,697 | 10/1998 | Hamilton et al. . |

FOREIGN PATENT DOCUMENTS

| | | |
|---|---|---|
| 0 730 152 A2 | 9/1996 | European Pat. Off. . |
| 4234466 | 4/1994 | Germany . |
| 7-326599 | 12/1995 | Japan . |

OTHER PUBLICATIONS

Webster's Ninth New Collegiate Dictionary, Merriam–Webster (New York) 1987 p. 1017.

"An Analysis of Particle Adhesion on Semiconductor Surfaces" R. A. Bowling, J. Electrochem. Soc., Sep. 1985, 2208–2214.

"Cleaning Techniques for Wafer Surfaces", K. Skidmore, Semiconductor International/81–85, Aug. 1987.

*Primary Examiner*—Jan Ludlow
*Attorney, Agent, or Firm*—Margaret M. Brumm; Thomas M. Breininger

[57] ABSTRACT

A method for determining wafer cleanliness by fluorometric monitoring of the impurities in the semiconductor chip wafer rinse solution. A clean chip is indicated by a leveling off of increased concentration of impurities as the rinsing of the chip progresses. A method for optimizing reuse or recyling of the water discharged from the rinse process which accurately measures the contaminants in that water.

9 Claims, No Drawings

FLUOROMETRIC METHOD FOR INCREASING THE EFFICIENCY OF THE RINSING AND WATER RECOVERY PROCESS IN THE MANUFACTURE OF SEMICONDUCTOR CHIPS

FIELD OF THE INVENTION

A method for determining wafer cleanliness by fluorometric monitoring of the impurities in the semiconductor chip wafer rinse solution. A clean chip is indicated by a leveling off of increased concentration of impurities as the rinsing of the chip progresses. A method for optimizing reuse or recyling of the water discharged from the rinse process which accurately measures the contaminants in that water.

BACKGROUND OF THE INVENTION

Semiconductor devices, whether of the single element or integrated circuit type, are fabricated universally from monocrystalline material in slice form. Each slice provides a large number of devices. Semiconductor discs are obtained from monocrystalline semiconductor rods by sawing the rods into sections. The discs are then attached to polishing plates with, for example, beeswax, a synthetic wax or another adhesive and polished using a polishing agent. The polished discs are contaminated with the adhesive, traces of the polishing agent, and with other impurities. Since even small amounts of impurities can cause considerable variation of the electrical parameters of the finished structural elements, the discs have to be thoroughly cleaned to remove the impurities.

The cleaning of the polished discs is usually effected in two successive essentially different operations: first, a washing operation involving dissolution and rinsing operations and, secondly, a mechanical cleaning operation to remove the last traces of impurities from the disc surface.

The washing step, as generally carried out, involves a number of separate operations. The wax, cement or other adhesive remains are first removed by dissolution in a convenient solvent, which is suitable in an ultrasonic tank or a steam vessel. An example of such solvent is trichloroethylene. The discs are then washed with acetone to remove any remaining trichloroethylene, after which they are rinsed with water. They are then immersed in concentrated nitric acid and again rinsed with water. The discs are usually then immersed in hydrofluoric acid so as to render their surfaces hydrophobic, and once more rinsed with water. There then follows the mechanical cleaning stage consisting mostly of wiping or rubbing with suitable rags. It is apparent that the washing operation is complicated, time-consuming, and expensive.

Freshly sawn, lapped or ground silicon wafers are extremely dirty by comparison to subsequent manufacturing requirements and must be cleaned, if subsequent electronic device fabrication processes are to be successful. Among the components of the dirt on the wafers are spindle oil; handcream; silicon particles; silicon powder; cooling solution, including wetting agents; lapping and polishing grit; epoxy casting compounds; human finger prints; colloidal silicon dioxide; sodium dichloroisocyanurate and its reaction products with sodium carbonate; sodium carbonate; amorphous silicon dioxide; other metallic impurities deposited on silicon surfaces from slurry components, and possible other materials. If this dirt is not removed from the wafers, subsequent processing steps are adversely affected.

The need for damage-free, smooth and clean semiconductor wafer surfaces has become increasingly important. Smooth, polished surfaces are obtained by the use of polishing slurries. Silica polishing is an example of a typical polishing process. In the silica polishing process, a polishing slurry is used which includes a colloidal silicon dioxide abrasive, sodium dichloroisocyanurate as an oxidizing agent, and sodium carbonate as a base. The pH of the polishing slurry is below 10. After polishing, it is necessary to clean the polished surface to remove the polishing slurry and other surface contaminants with a minimum of chemical or mechanical surface damage.

Fine particulates which adhere to a silicon semiconductor surface can reduce the yield or efficiency of the wafer as can be well imagined. These particles will adhere to one another, creating larger size particles termed agglomerates. The origins of the particles are literally too numerous to list: dust, pollen, flakes of human skin, oxides, etc, as well as debris from slicing and lapping operations.

The primary holding forces are van der Waals forces and electrostatic forces. Chemical bonding may also prevail. Numerous methods have heretofore been proposed for reducing or purging the particles: filtering the air in the production facility, personal fastidiousness, spinning the wafer to centrifuge the particles, immersing the wafer in a liquid to reduce adhesion, and so on. Immersion, however, can introduce another force, namely capillary attraction upon removal of the wafer from the immersion bath.

The foregoing is set forth in more detail in an article entitled "An Analysis of Particle Adhesion on Semiconductor Surfaces," R. Allen Bowling in SOLID-STATE SCIENCE AND TECHNOLOGY, September 1985, presenting the ultimate conclusion that emphasis should be placed on prevention of particle deposition in the first place rather than relying on subsequent removal efforts.

The article by R. Allen Bowling takes into account an earlier investigation of detergent cleaning, both aqueous and nonaqueous, as a means of removing the offending particles, but this technique did not alter the author's conclusion. Indeed, the author stressed criticality of the size of detergent molecules, which must be small enough to wedge between the offending particles and the silicon surface, meaning that effective removal by detergents would involve relations between the size of the offending particle and the size of the detergent molecule.

Detergents are organic in nature: many are of a polar nature and themselves tend to bond to the wafer chemically as noted in a recent article, "Cleaning Techniques for Wafer Surfaces" (Semi-International, 1987) This same article stresses use of ultrasonics and megasonics as aids in chemical cleaning, deemed especially helpful in loosening polar bonds such as those which can arise from the use of peroxides; for example, ammonium hydroxide-peroxide solutions are employed to break the strong electrical particle bonds.

The 1987 article concludes by updating chemical cleaning, also known as wet chemistry. Considerable detail is presented in terms of the complex mechanics employed for wet chemistry (immersion bath equipment, centrifugal spray equipment, and so on) Few details of chemistry are discussed, only generalities for the most part, such as "acids," "oxygen plasmas," "choline chemistry" and "RCA chemistry." Choline chemistry, because of its foul odor presents a handling problem. Therefore, it is reluctantly accepted, provided a closed system is adopted. The so-called "RCA chemistry" involves two aqueous systems applied in sequence, namely, an $NH_4OH/H_2O_2$ treatment followed by an $HCl/H_2O_2$ treatment. The solutions are volatile, giving off noxious fumes which, if they mix, result in settlement of NH$_4$Cl particles. Other problems are discussed.

Processing the wafer by methods described above depends a great deal upon whether the wafer is one freshly sliced from the rod of crystals on which it grew or whether it is a wafer which has undergone subsequent IC fabrication such as resist coating, photolithography, insertion of conductor pins and so on. Thus, one can compare the disclosure in U.S. Pat. No. 4,159,619 which addresses prefabrication surfactant cleaning of freshly sliced, polished wafers and the disclosure in U.S. Pat. No. 4,276,186 where the concern is with an effort to purge an IC module of solder flux residue and to remove from the chip the so-called top seal material. Many chemicals when used by themselves tend to objectionably discolor and etch the wafer surface; hence great care is required. Discoloration of the wafer is perceived by the electronics industry as a possible source of electrical problems.

As is evident from the above discussion, it is very important that the chip be clean. Yet, how is it determined that the chip is clean? One method for determining wafer cleanliness is disclosed in U.S. Pat. No. 4,156,619, a swab test. As a means of determining wafer cleanliness, one could dip a cotton swab in methylene chloride and scrub it across the wafer. The wafer could only considered clean if the swab looked clean following the scrubbing of the wafer. This is a visual technique which will not result in the highly accurate and precise determination of whether or certain contaminants, invisible to the naked eye, are still on the chip. Though a method for determining the concentration of a tracer-containing active agent in aqueous or nonaqueous active-agent solutions in cleaning solutions for the food processing industry as well as for industrial cleaning of flow-through washers in German Patent DE 4234466, there is no teaching of direct monitoring of impurities in the semiconductor chip manufacturing process, nor for the monitoring of cleaning solutions in the semiconductor chip manufacturing process. Accordingly, it is an object of this invention to provide a quick and accurate method to determine semiconductor chip cleanliness by either directly monitoring the impurities, or indirectly by monitoring the cleaning solution associated with the semiconductor chip cleaning process.

SUMMARY OF THE INVENTION

A method for determining wafer cleanliness by fluorometric monitoring of the impurities in the semiconductor chip wafer rinse solution. A clean chip is indicated by a leveling off of increased concentration of impurities as the rinsing of the chip progresses.

A method for optimizing reuse or recyling of the water discharged from the rinse process which accurately measures the contaminants in that water.

DESCRIPTION OF THE INVENTION

To quantify the fluorescent characteristic of a target-specie indicator, a variety of fluorescence analysis methods are available for use singly or in combination. Such fluorescence analysis techniques include, without limitation, techniques that measure and/or indicate:

1. the appearance or disappearance of fluorescence;
2. a shift in excitation and/or emission wavelengths of fluorescence;
3. a fluorescence quenching (by a specific substance) or elimination of quenching;
4. fluorescence changes based on specific light absorbance changes (increase or decrease);
5. a well-defined temperature-dependency of fluorescence;
6. a well-defined pH-dependency or other water condition dependency of fluorescence; and
7. the exploitation of a temperature-dependency and/or pH-dependency of fluorescence to see or enhance the effects of techniques 1 to 4.

The detection and quantification of specific substances by fluorescence emission spectroscopy are founded upon the proportionality between the amount of emitted light and the amount of a fluorescent substance present. When energy in the form of light, including ultra violet and visible light, is directed into a sample cell, fluorescent substances therein will absorb the energy and then emit that energy as light having a longer wavelength than the absorbed light. A fluorescing molecule absorbs a photon resulting in the promotion of an electron from the ground energy state to an excited state. When the electron's excited state relaxes from a higher energy vibrationally-excited state to the lowest energy vibrationally-excited state, energy is lost in the form of heat. When the electron relaxes to the ground electronic state, light is emitted at a lower energy than that absorbed due to the heat-energy loss, and hence at a longer wavelength than the absorption. The amount of emitted light is determined by a photodetector. In practice, the light is directed into the sample cell through an optical light filter so that the light transmitted is of a known wavelength, which is referred to as the excitation wavelength and generally reported in nanometers ("nm"). The sample cell is designed to optimize the fluorescence response for the analyte, depending on the analysis method chosen. The emitted light is similarly screened through a filter so that the amount of emitted light is measured at a known wavelength or a spectrum of wavelengths, which is referred to as the emission wavelength and generally also reported in nanometers. When the measurement of the fluorescence intensity of specific substances or categories of substances at low concentrations is desired or required, such as often is the case for the process of the present invention, the filters are set for a specific combination of excitation and emission wavelengths, selected for substantially optimum low-level measurements.

In general, the concentration of a target-specie indicator or fluorescent tracer can be determined from a comparison of a sample's emission intensity to a calibration curve of the given target-specie indicator's or tracer's concentration versus emission, for the same set of excitation wavelength/emission wavelengths. Such a concentration-by-comparison method by which the sensed emissions are converted to a concentration equivalent preferably is employed to determine concentrations of a target-specie indicator or tracer that are within the concentration range over which a linear emission response is observed, and this concentration range is referred to herein as the "linear-emission-response concentration range". The linear-emission-response concentration range is to some extent dependent upon the specific target-specie indicator, tracer, cell path length and configuration and the excitation wavelength/emission wavelength set employed. At target-specie indicator or tracer concentrations higher than a given fluorescent target-specie indicator's or tracer's linear-emission-response concentration range, there is a negative deviation from ideal (linear) behavior, the degree of emission for a given concentration being less than predicted by a linear extrapolation. In such instances, the sample can be diluted by known factors until the concentration of the fluorescent target-specie indicator or tracer therein falls within the linear-emission-response concentration range. Two other correction techniques are available when the concentration is higher than the linear-emission-response concentration range where the linear response range is defined as within ± ten percent of the perfectly linear response. Since the linear-emission-response concentration range is to some extent dependent upon the excitation wavelength/emission wavelength set employed, an alternate excitation wavelength/emission wavelength set could be used. The use of sample cells with shorter pathlengths for the excitation/emission light will also correct or alleviate the problem. If the fluorescent target-specie indicator or tracer is present in the sample at only exceptionally low concentrations, there are techniques for concentrating the target-specie indicator or tracer by known factors until its concentration falls within the linear-emission-response concentration range or is otherwise more readily measured, for instance by liquid-liquid extraction. Nonetheless, preferably a calibration curve over the linear-emission-response concentration range would be prepared or obtained before employing a given target-specie indicator or tracer. Preferably, the target-specie indicator or tracer would be respectively selected or added to the water treatment agent feed in an amount sufficient to provide a concentration of the target-specie indicator or tracer in the sample that is within the linear-emission-response concentration range. Generally, the linear-emission-response concentration range of a fluorescent target-specie indicator or tracer is sufficiently broad to readily determine the amount of the target-specie-indicator or tracer that will be sufficient for this purpose. A linear-emission-response concentration range for an unmodified sample and typical standard equipment will most often extend through a concentration range from a concentration of "m" to a concentration of at least 2,000 m. When "extended" operation techniques are employed, for instance sample dilution, use of an optimal alternate excitation wavelength/emission wavelength set, and/or use of optimal small cell pathlengths, a linear-emission-response concentration range can be extended from m to 10,000,000 m and beyond. One example of a measurable operating range (extending from m to 10,000,000m) is from about 1 part per billion (designated as m in this example) to about 10,000 parts per million (designated as 10,000,000 m in this example).

A determination of the concentration of a target-specie indicator or tracer in a system can be made when the concentration of the target-specie indicator or tracer in the water system is as low as several parts per million (ppm), or parts per billion (ppb), and at times as low as parts per trillion (ppt). In preferred embodiment, the amount of a fluorescent tracer added to the water treatment agent feed should be sufficient to provide a concentration of the tracer in the water system sample of from about 50 ppt to about 10 ppm. The capability of measuring very low levels is an immense advantage. Such fluorescence analyses (the measurements of the light emitted in response to the light transmitted to the water system sample) can be made on-site, preferably on an almost instant and continuous basis, with simple portable equipment.

As mentioned above, at times it may be desired to monitor a plurality of fluorescent target-specie indicators or tracers. For instance, it may be desired to monitor more than one target specie, or a target-specie indicator and tracer for each of one or more water treatment agents, or distinct target-species indicators for more than one water treatment agent. In some instances, it may be desired to use a plurality of target-specie indicators and/or tracers solely for a single water treatment agent, for instance to confirm that a target-specie indicator or tracer is not undergoing any selective loss. Such separate and distinct target-specie indicators or tracers can all be detected and quantified in a single water system sample despite all being fluorescent substances if their respective wavelengths of emission do not interfere with one another. Thus, concurrent analyses for multiple target-specie indicators or tracers are possible by selection of target-specie indicators or tracers having appropriate spectral characteristics. Preferably, separate wavelengths of radiation should be used to excite each of the target-specie indicators or tracers, and their fluorescent emissions should be observed and measured at separate emission wavelengths. A separate concentration calibration curve may be prepared or obtained for each target-specie indicator or tracer. In other words, more than one target-specie indicator or tracer can be employed, and then the presence and/or concentration of each such target-specie indicator or tracer in the water system may be determined using analytical parameters (particularly the excitation/emission wavelengths) effective for each such target-specie indicator or tracer, which analytical parameters preferably are sufficiently distinct to differentiate between measurements. Since a plurality of target-specie indicators or tracers may be separately but concomitantly monitored, the present invention does not exclude the use of one or more additional target-specie indicators or tracers for purposes other than the present invention, nor does it exclude the concomitant use of a target-specie indicator or tracer for purposes of the present invention and for some other purpose.

Fluorescence emission spectroscopy on a substantially continuous basis, at least over a given time period, is one of the preferred analytical techniques for the process of the present invention. It is one of the preferred analysis techniques for quantifying and determining the concentration of the target-specie indicator or tracer in a system for regulating water treatment agents and it is an analysis technique having significant advantages.

A dual-monochromator spectrofluorometer can be used for a fluorometric analysis conducted on an intermittent basis and for on-line and/or continuous fluorescence regulating. Portable or compact fluorometers equipped with appropriate excitation and emission filters and quartz flow through cells are commercially available, for instance from Turner Designs (Sunnyvale, Calif.).

In general, for most fluorescence emission spectroscopy methods having a reasonable degree of practicality, it is preferable to perform the analysis without isolating in any manner the target-specie indicator or tracer. Thus, there may be some degree of background fluorescence in the water system on which the fluorescence analysis is conducted, which background fluorescence may come from chemical compounds in the water system that are unrelated to the present invention. In instances where the background fluorescence is low, the relative intensities (measured against a standard fluorescent compound at a standard concentration and assigned a relative intensity, for instance a relative intensity of 100) of the fluorescence of the target-specie indicator or tracer versus the background can be very high, for instance a ratio of 100/10 or 100/2 when certain combinations of excitation and emission wavelengths are employed even at low target-specie indicator or tracer concentrations, and such ratios would be representative of relative performance (under like conditions) of respectively 10 and 50. In preferred embodiment, the excitation/emission wavelengths and/or the target-specie indicator or tracer are selected to provide a relative fluorescence of at least about 5 or 10 for the given background fluorescence anticipated.

For instance, for most water system backgrounds, a compound that has a relative performance of at least about 5 at a reasonable concentration is very suitable as a target-specie indicator or tracer. When there is or may be a specific chemical specie of reasonably high fluorescence in the background, the target-specie indicator or tracer and/or the excitation and/or emission wavelengths often can be selected to nullify or at least minimize any interference of the tracer measurement(s) caused by the presence of such specie.

One method for the continuous on-stream monitoring of chemicals by fluorescence emission spectroscopy and other analysis methods is described in U.S. Pat. Nos. 4,992,380 and 5,435,969, the disclosures of which are incorporated hereinto by reference.

When the target-specie indicator is nonfluorescent and the incipient reagent is fluorescence, a fluorescence analysis technique, such as those described above, will be focused on the fluorescence of the incipient reagent. The measure of the target specie will be the loss of the incipient reagent, as it is consumed in the formation of the target-specie indicator, as manifested by the change of its fluorescence intensity and/or excitation/emission wavelength characteristics. Similarly, if both the target-specie indicator and the incipient reagent are fluorescent, but have different fluorescent characteristics, for instance different wavelengths of maximum emission, the fluorescence analysis technique might focus on the loss of light emitted at the incipient reagent's wavelength of maximum emission, or instead on the increase of light emitted at the target-specie indicator's wavelength of maximum emission, as a function of the formation of the target-specie indicator from the interaction between the incipient reagent and target specie.

Colorimetry, chemiluminescence or spectrophotometry, with or without chemometrics analysis, may be employed to detect and/or quantify a chemical tracer. Colorimetry is a determination of a chemical specie from its ability to absorb ultraviolet or visible light. One calorimetric analysis technique is a visual comparison of a blank or standard solution (containing a known concentration of the tracer specie) with that of a sample of the fluid being monitored. Another calorimetric method is the spectrophotometric method wherein the ratio of the intensities of the incident and the transmitted beams of light are measured at a specified wavelength by means of a detector such as a photocell or photomultiplier tube. Using a calorimetric probe, a fiber optic (dual) probe, such as a Brinkman PC-80 probe (570 nm filter), a sample solution is admitted to a flowcell in which the probe is immersed. One fiber optic cable shines incident light through the sample liquid onto a mirror inside the cell and reflected light is transmitted back through the sample liquid into a fiber optic cable and then to the colorimetric analyzer unit, which contains a colorimeter, by the other cable. The colorimeter has a transducer that develops an electrical analog signal of the reflected light characteristic of the tracer concentration. The voltage emitted by the transducer activates a dial indicator and a continuous line recorder printout unit. A set point voltage monitor may be employed to constantly sense or monitor the voltage analog generated by the colorimeter, and upon detection of a tracer signal, a responsive signal may be transmitted to a responsive treatment agent feed line to commence or alter the rate of feed. Such a colorimetric analysis technique and the equipment that may be employed therefor are described in U.S. Pat. No, 4,992,380, incorporated hereinto by reference.

Chemical tracers suitable for use in conjunction with a colorimetric technique include transition metals and substances which show light absorbance which is detectable from that of other species present in the system fluid or substances which react with color-forming reagents to produce light absorbance which is detectable from that of other species present in the system fluid.

An ion selective electrode may be used to determine the concentration of an inert chemical tracer through the direct potentiometric measurement of specific ionic tracers in aqueous systems. These electrodes respond only to selected ionic materials and gases dissolved in liquids, and hence such tracers must be ionized (or dissolved gases) in the environment in which they are to be determined. Ion selective electrodes depend on a potential developed across a thin membrane by the difference in the concentrations of the ion (or gas) to be measured on each side of the ionically conducting thin layer. The concentration within the electrode is fixed and the potential varies with the concentration of ions (or gas). By calibration (the potential or current versus the concentration), the ionic (or gas) concentration at the sample electrode can be indexed to a reference or standard electrode that is insensitive to the tracer ion. To provide continuous monitoring of the tracer, the electrodes may be dipped directly into a stream of one of the fluids (collectively comprising a flow cell), or the fluid being monitored may be passed through an external flow cell into which the ion-selective and reference electrodes have been inserted. An ion selective electrode tracer monitoring technique and the equipment therefor are described in U.S. Pat. No 4,992,380, incorporated hereinto by reference.

The present invention in broad embodiment does not exclude the use of such other techniques for monitoring a target-specie indicator, particularly when the target-specie indicator is the target specie itself, particularly when such an alternative method can be conducted without undue interference, and with sufficient rapidity for purposes of determining the system consumption for the target specie.

Analytical techniques for quantifying the presence and/or concentration of a chemical specie without isolation thereof are within an evolving technology, and the above survey of analytical techniques for use in monitoring a target-specie indicator or tracer in the process of the present invention may presently not even be exhaustive, and most likely techniques equivalent to the above for the purposes of the present invention will be developed in the future.

In the semiconductor chip manufacturing process, fluorescence of the impurity can be monitored directly as an indicator of chip cleanliness or reusability of rinse process water. Moreover, an inert tracer material may be added for indirect monitoring of impurities as above. Such inert tracer may be added to the rinse solution directly, or in a sidestream at a different point in the semiconductor chip manufacturing process.

The invention is a method for improving the efficiency of semiconductor chip cleaning during semiconductor chip manufacture comprising the steps of:

a) cleaning the semiconductor chip by a rinsing process to remove impurities from the surface of the chip by dipping the chip repeatedly in an aqueous rinse solution;

b) monitoring the rinse solution fluorometrically for fluorescent impurity while dipping the chip to determine said impurities' concentration in said rinse solution;

c) correlating fluorometric values for said impurities to concentration amounts of said impurities;

d) observing an increase in the concentration of the impurities during the rinsing process as determined in step c); and e) determining that the chip is clean, as completion of the rinsing process is indicated when the concentration of impurities in the rinse solution ceases the increasing of step d) and becomes constant.

In this manner, as cleaning occurs and the impurity washes off the chip, it is to be expected that the amount of the impurity in the cleaning solution will increase. However, at a point where no more impurity can be removed, the amount of impurity will become a constant value (cease increasing). This indicates that the cleaning process is complete.

For the practice of any aspect of the invention, the fluorometric detection may be a fluorescence technique, and monitoring may be of at least one fluorescence emission value. Furthermore, for the practice of any aspect of this invention, cleaning may occur subsequent to the polishing process of semiconductor chip manufacture. The chip may be dipped successively in a series of said rinse solutions. It is within the purview of this invention that either a single impurity may be monitored, or more than one impurity may be monitored at a time.

Another aspect of the invention is a method for improving the efficiency of semiconductor chip cleaning during semiconductor chip manufacture comprising the steps of:

a) cleaning the semiconductor chip by a rinsing process to remove impurities from the surface of the chip by spraying the chip repeatedly with an aqueous rinse solution;
 b) collecting the spent rinse solution that washes off the chip;
 c) monitoring the said spent solution fluorometrically for fluorescent impurities, to determine said impurities' concentration in said spent rinse solution;
 d) correlating fluorometric values for said impurities to concentration amounts of said impurities;
 e) observing an increase in the concentration of the impurities during the rinsing process as determined in step d); and
 f) determining that the chip is clean, as completion of the rinsing process is indicated when the concentration of impurities in the rinse solution ceases the increasing of step e) and becomes constant.

Another aspect of this invention is a method for increasing the efficiency of the semiconductor chip cleaning process during semiconductor chip manufacture comprising the steps of:

a) cleaning the semiconductor chip by a rinsing process to remove impurities from the surface of the chip by dipping the chip repeatedly in an aqueous rinse solution;
 b) monitoring said rinse solution fluorometrically for fluorescing impurities;
 c) correlating fluorometric values for said impurities to concentration amounts of said impurities; and,
 d) determining whether said rinse solution contains said impurities in a concentration above or below a predetermined acceptable threshold concentration of said impurities;
 e) reusing said rinse solution if said concentration of said impurities are below said acceptable threshold concentration; and
 f) discarding said rinse solution if said concentration of said impurities are above said acceptable threshold concentration.

Yet another aspect of this invention is a method for increasing the efficiency of the semiconductor chip cleaning process during semiconductor chip manufacture comprising the steps of:

a) cleaning the semiconductor chip by a rinsing process to remove impurities from the surface of the chip by spraying the chip repeatedly in an aqueous rinse solution;
 b) collecting the spent rinse solution that washes off the chip;
 c) monitoring said rinse solution fluorometrically for fluorescent impurities, to determine said impurities' concentration in said spent rinse solution;
 d) correlating fluorometric values for said impurities to concentration amounts of said impurities;
 e) determining whether said spent rinse solution contains said impurities in a concentration above or below a predetermined acceptable threshold concentration of said impurities; and
 f) reusing said rinse solution if said concentration of said impurities are below said acceptable threshold concentration;
 g) discarding said rinse solution if said concentration of said impurities are above said acceptable threshold concentration.

A further aspect of this invention is a method for improving the efficiency of semiconductor chip production comprising the steps of:

a) cleaning the semiconductor chip by a rinsing process to remove impurities from the surface of the chip with an aqueous rinse solution;
 b) monitoring said rinse solution fluorometrically to obtain a fluorometric reading for fluorescent impurities;
 c) determining from said reading the identity of said impurities; and
 d) adjusting said production accordingly to decrease said impurities.

This method would be advantageous in two ways. The first is that the technique could be utilized to monitor for the presence of an impurity not normally in the rinse stream. The presence of this impurity could indicate a malfunction somewhere up the line in the manufacture process. This could serve as an early indicator of a problem with production which requires adjusting. The second advantage of such a technique would be that certain purities would be expected by-products of the manufacturing process. They would routinely be present within a certain acceptable range. When the detection method indicates the impuritys' presence in a greater than expected amount, it would indicate that the part of the manufacturing process which causes the presence of that impurity needs adjusting.

Using the techniques described above, the following semiconductor chip rinse solution organic can be monitored among others: acetone; butyl acetate; ethoxyethyl acetate; ethyl benzene; ethylene glycol; isopropanol; methyl ethyl ketone; n-methyl pyrollidone; tetramethyl ammonium hydroxide; xylene; sulfonates; carboxylates; phosphates; cholines polyglycidols; poly(oxyethylene) alcohols; betaines; and dioctylphthalates. This list is not exhaustive, as any fluorescent impurity may be suitably be analyzed by this technique.

The following examples are presented to describe preferred embodiments and utilities of the invention and are not meant to limit the invention unless otherwise stated in the claims appended hereto.

EXAMPLE 1

A fluorometer would be set up to measure certain organics in the rinse bath. Wafers have a process step performed on them, and then are rinsed in ultra-pure water baths. The rinsing is to remove impurities (some of these are the organics on the attached list) from the previous step before moving onto the next processing step. Normally, the wafers (chips) remain in the rinse tank for a predetermined amount of time, but optimization of this time has not occurred to any great extent. It is to be expected that as the rinsing removes a particular impurity from a chip, ever increasing amounts of that impurity will leave the chip and go into the spent rinse solution. By measuring the increase in organics in the bath, and determining the point at which no more organics are being removed in the bath, as indicated by a leveling off, or constant concentration of the impurity monitored processing could be accelerated, reducing manufacturing cycle time.

EXAMPLE 2

A fluorometer would measure certain organics in the water discharged from the baths. The signal from the fluorometer would be monitored, and when it exceeded a certain level, would cause valves to be activated to replenish the water in the bath with water having an acceptably low concentration of the deleterious organics.

EXAMPLE 3

Water would flow through a fluorometer on an ongoing basis. When the signal exceeds a certain level, valves would be activated to direct the water to a process to reduce the organic content to an acceptable level. This method could also be used downstream of the removal process to control it as well.

EXAMPLE 4

The fluorometer would be used to monitor the presence of certain impurities. When the specific impurity monitored (which would be a known by-product of a certain specific portion of the manufacturing process) is present in the rinse water above a certain (usual) level, it would be an indication that the upstream processing in chip manufacture which results in that impurity's presence is off, and needs adjusting. That upstream process could then be adjusted in response to the unusual increase in a particular process by-product. Thus, the method described could be utilized as an indicator for fine-tuning of the manufacturing process.

Changes can be made in the composition, operation and arrangement of the method of the present invention described herein without departing from the concept and scope of the invention as defined in the following claims:

We claim:

1. A method for improving the efficiency of semiconductor chip cleaning during semiconductor chip manufacture comprising the steps of:
   a) cleaning the semiconductor chip by a rinsing process to remove impurities from the surface of the chip by dipping the chip repeatedly in an aqueous rinse solution;
   b) monitoring the rinse solution fluorometrically for fluorescent impurities while dipping the chip to determine said impurities concentration in said rinse solution;
   c) correlating fluorometric values for said impurities to concentration amounts of said impurities;
   d) observing an increase in the concentration of the impurities during the rinsing process as determined in step c); and
   e) determining that the chip is clean, as completion of the rinsing process is indicated when the concentration of impurities in the rinse solution ceases the increasing of step d) and becomes constant.

2. The method of claim 1 wherein said fluorometric detection is a fluorescence technique, and monitoring is of at least one fluorescence emission value.

3. The method of claim 1 wherein said cleaning occurs subsequent to the polishing process of semiconductor chip manufacture.

4. The method of claim 1 wherein the chip is dipped successively in a series of said rinse solutions.

5. A method for improving the efficiency of semiconductor chip cleaning during semiconductor chip manufacture comprising the steps of:
   a) cleaning the semiconductor chip by a rinsing process to remove impurities from the surface of the chip by spraying the chip repeatedly with an aqueous rinse solution;
   b) collecting the spent rinse solution that washes off the chip;
   c) monitoring said spent solution fluorometrically for fluorescent impurities, to determine said impurities' concentration in said spent rinse solution;
   d) correlating fluorometric values for said impurities to concentration amounts of said impurities;
   e) observing an increase in the concentration of the impurities during the rinsing process as determined in step d); and
   f) determining that the chip is clean, as completion of the rinsing process is indicated when the concentration of impurities in the rinse solution ceases the increasing of step e) and becomes constant.

6. The method of claim 5 wherein said fluorometric detection is a fluorescence technique, and monitoring is of at least one fluorescence emission value.

7. The method of claim 5 wherein said cleaning occurs subsequent to the polishing process of semiconductor chip manufacture.

8. A method for increasing the efficiency of the semiconductor chip cleaning process during semiconductor chip manufacture comprising the steps of:
   a) cleaning the semiconductor chip by a rinsing process to remove impurities from the surface of the chip by dipping the chip repeatedly in an aqueous rinse solution;
   b) monitoring said rinse solution fluorometrically for fluorescing impurities;
   c) correlating fluorometric values for said impurities to concentration amounts of said impurities; and,
   d) determining whether said rinse solution contains said impurities in a concentration above or below a predetermined acceptable threshold concentration of said impurities;
   e) reusing said rinse solution if said concentration of said impurities are below said acceptable threshold concentration; and
   f) discarding said rinse solution if said concentration of said impurities are above said acceptable threshold concentration.

9. A method for increasing the efficiency of the semiconductor chip cleaning process during semiconductor chip manufacture comprising the steps of:
   a) cleaning the semiconductor chip by a rinsing process to remove impurities from the surface of the chip by spraying the chip repeatedly with an aqueous rinse solution;

b) collecting the spent rinse solution that washes off the chip;

c) monitoring said rinse solution fluorometrically for fluorescent impurities, to determine said impurities' concentration in said spent rinse solution;

d) correlating fluorometric values for said impurities' to concentration amounts of said impurities;

e) determining whether said spent rinse solution contains said impurities in a concentration above or below a predetermined acceptable threshold concentration of said impurities; and f) reusing said rinse solution if said concentration of said impurities are below said acceptable threshold concentration;

g) discarding said rinse solution if said concentration of said impurities are above said acceptable threshold concentration.

* * * * *